US012690200B2

(12) United States Patent
Park et al.

(10) Patent No.: US 12,690,200 B2
(45) Date of Patent: Jul. 21, 2026

(54) INTEGRATED CIRCUIT DEVICE

(71) Applicant: Samsung Electronics Co., Ltd.,
Suwon-si (KR)

(72) Inventors: Jungmin Park, Suwon-si (KR); Hanjin Lim, Suwon-si (KR); Hyungsuk Jung, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 382 days.

(21) Appl. No.: 18/394,644

(22) Filed: Dec. 22, 2023

(65) Prior Publication Data

US 2024/0213302 A1      Jun. 27, 2024

(30) Foreign Application Priority Data

Dec. 27, 2022    (KR) ........................ 10-2022-0186390

(51) Int. Cl.
H10D 1/68          (2025.01)
H10B 12/00         (2023.01)
(52) U.S. Cl.
CPC ............. H10D 1/68 (2025.01); H10B 12/315 (2023.02)
(58) Field of Classification Search
CPC ................................ H10D 1/68; H10B 12/315
See application file for complete search history.

(56) References Cited

U.S. PATENT DOCUMENTS

| | | | |
|---|---|---|---|
| 7,002,788 B2 | 2/2006 | Jeong et al. | |
| 8,437,174 B2 | 5/2013 | Meade et al. | |
| 9,219,225 B2 | 12/2015 | Karda et al. | |
| 9,455,259 B2 | 9/2016 | Lim et al. | |
| 11,316,027 B2 | 4/2022 | Chang et al. | |
| 2008/0017954 A1 | 1/2008 | Suzuki et al. | |
| 2014/0231958 A1 | 8/2014 | Lim et al. | |
| 2018/0286988 A1* | 10/2018 | Yoo ..................... H10D 30/701 | |

* cited by examiner

*Primary Examiner* — Matthew L Reames
(74) *Attorney, Agent, or Firm* — HARNESS, DICKEY & PIERCE, P.L.C.

(57)          ABSTRACT

An integrated circuit device may include a transistor on a substrate and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers that are alternately stacked. The plurality of first dielectric layers may include a ferroelectric material, and the plurality of second dielectric layers may include an anti-ferroelectric material. The distribution proportion of internal defect dipoles gradually may vary in a thickness direction of the dielectric layer structure.

20 Claims, 13 Drawing Sheets

B2 – B2'

INTEGRATED CIRCUIT DEVICE

CROSS-REFERENCE TO RELATED APPLICATION

This application is based on and claims priority under 35 U.S.C. § 119 to Korean Patent Application No. 10-2022-0186390, filed on Dec. 27, 2022 in the Korean Intellectual Property Office, the disclosure of which is incorporated by reference herein in its entirety.

BACKGROUND

Inventive concepts relate to an integrated circuit device, and more particularly, to an integrated circuit device including a capacitor.

The degree of integration of integrated circuit devices has rapidly increased along with the recent rapid development of fine semiconductor processing technology, and thus the area of unit cells has decreased. Therefore, the area occupied by a capacitor within a unit cell has also decreased. For example, as the degree of integration of integrated circuit devices such as dynamic random access memory (DRAM) increases, the area of unit cells decreases but the same or greater capacitance may be required. Therefore, there may be a need for a capacitor structure capable of maintaining desired electrical characteristics by improving capacitance in spite of spatial and design rule limitations.

SUMMARY

Inventive concepts provide an integrated circuit device including a dielectric layer structure in which dielectric layers have different properties such that when voltage is applied to vary a built-in electric field, a multi-bit status may be realized in a dielectric characteristic curve.

Aspects of inventive concepts are not limited to the aforesaid, but other aspects not described herein will be clearly understood by those skilled in the art from descriptions below.

According to an embodiment of inventive concepts, an integrated circuit device may include a transistor on a substrate and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers that are alternately stacked. The plurality of first dielectric layers may include a ferroelectric material, and the plurality of second dielectric layers may include an anti-ferroelectric material. The distribution proportion of internal defect dipoles gradually may vary in a thickness direction of the dielectric layer structure.

According to an embodiment of inventive concepts, an integrated circuit device may include a transistor on a substrate and a capacitor structure electrically connected to the transistor. The capacitor structure may include a first electrode, a dielectric layer structure on the first electrode, and a second electrode on the dielectric layer structure. The dielectric layer structure may include a single ferroelectric material. A distribution proportion of internal defect dipoles gradually may vary in a thickness direction of the dielectric layer structure.

According to an example embodiment of inventive concepts, an integrated circuit device may include a transistor on a substrate; and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers that may be alternately stacked. The plurality of first dielectric layers may include a ferroelectric material. The plurality of second dielectric layers may include an anti-ferroelectric material. The dielectric layer structure may include a lower stack structure and an upper stack structure having different arrangements. The lower stack structure and the upper stack structure may be defined based on a center of the dielectric layer structure in a vertical direction such that the lower stack structure may be under the center of the dielectric layer structure and the upper stack structure may be over the center of the dielectric layer structure. A distribution proportion of internal defect dipoles gradually may vary in the vertical direction of the dielectric layer structure.

BRIEF DESCRIPTION OF THE DRAWINGS

Embodiments will be more clearly understood from the following detailed description taken in conjunction with the accompanying drawings in which.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, example embodiments will be described with reference to the accompanying drawings.

Figure 1:
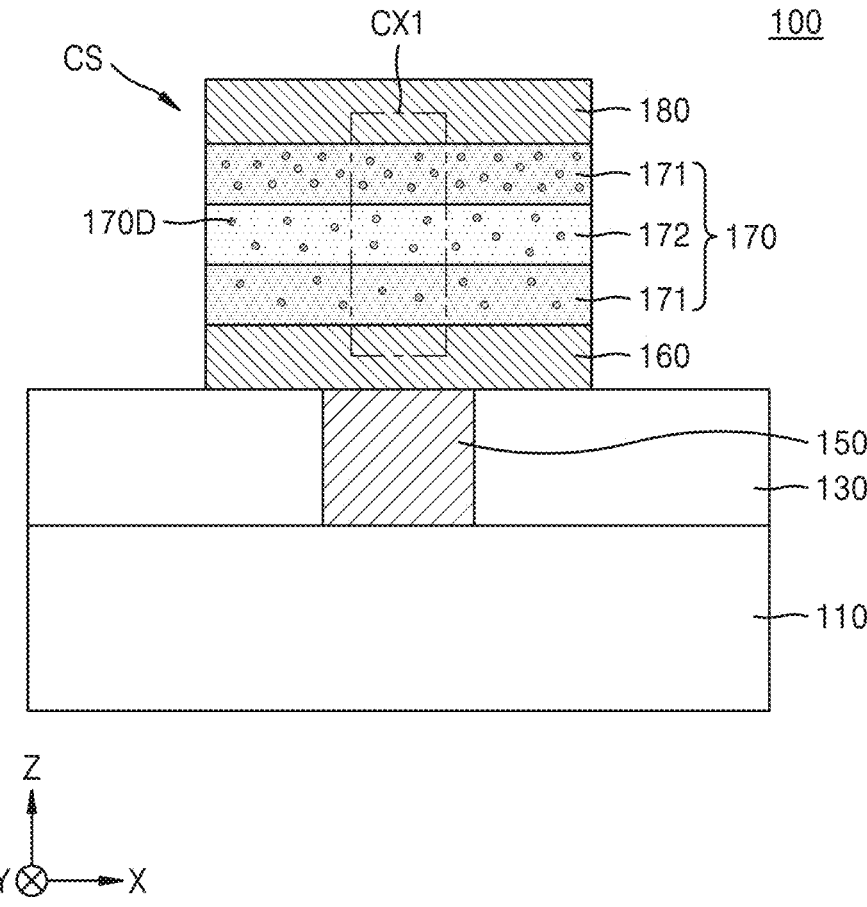
FIG. 1 is a cross-sectional view illustrating an integrated circuit device according to an embodiment.
Figure 2:
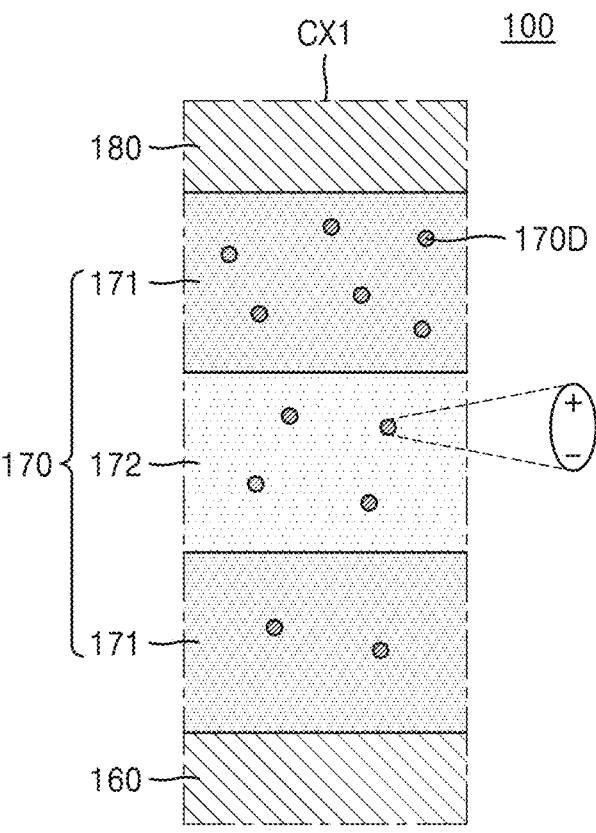
FIG. 2 is an enlarged view illustrating a portion CX1 of FIG. 1.
Figure 3:
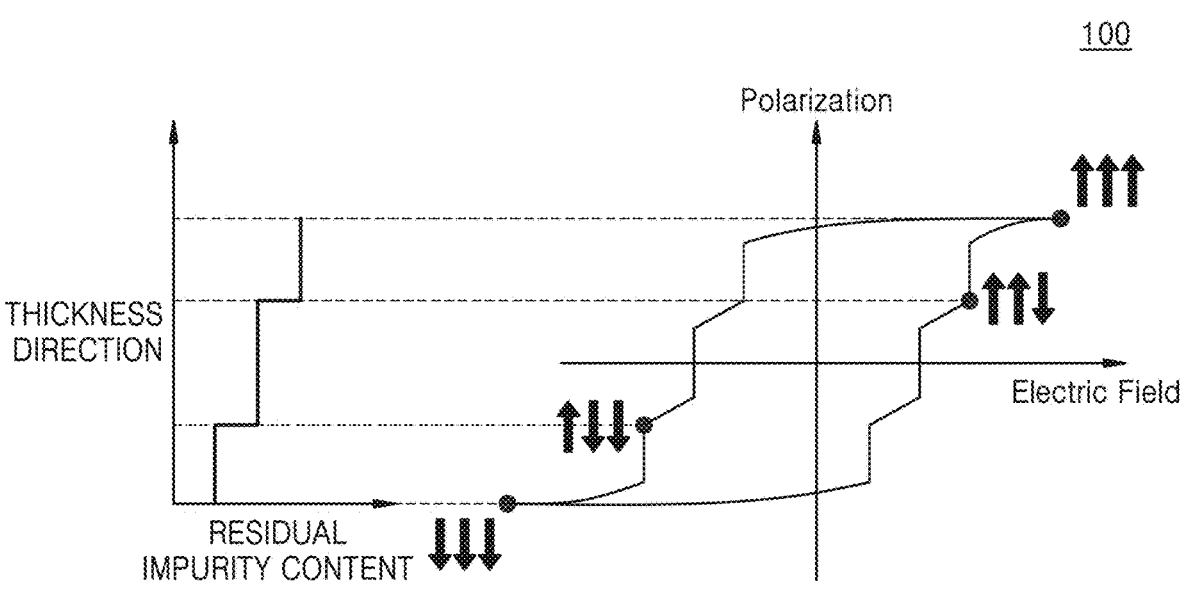
FIG. 3 is a graph schematically illustrating a stepwise step-to-step variation state of a dielectric characteristic curve of the integrated circuit device shown in FIG. 1.

FIG. 1 is a cross-sectional view illustrating an integrated circuit device 100 according to an embodiment, FIG. 2 is an enlarged view illustrating a portion CX1 of FIG. 1, and FIG. 3 is a graph schematically illustrating a stepwise step-to-step variation state of the dielectric characteristic curve of the integrated circuit device 100 shown in FIG. 1.

Referring to FIGS. 1 to 3 together, the integrated circuit device 100 may include a lower insulating layer 130 disposed on a substrate 110, a contact 150 disposed on the substrate 110 and partly covered with the lower insulating layer 130, and a capacitor structure CS disposed on the contact 150.

The substrate 110 may include a semiconductor material such as silicon (Si), germanium (Ge), silicon germanium (SiGe), silicon carbide (SiC), gallium arsenide (GaAs), indium arsenide (InAs), or indium phosphide (InP). In some embodiments, the substrate 110 may include a conductive region such as a well doped with a dopant or a structure doped with a dopant.

Although not shown in FIGS. 1 to 3, a switching device such as a transistor or a diode configured to provide a signal to the capacitor structure CS may be provided on the substrate 110. The lower insulating layer 130 may be formed on the substrate 110 to cover the switching device, and the contact 150 may be electrically connected to the switching device.

The capacitor structure CS may include a first electrode 160, a dielectric layer structure 170, and a second electrode 180 that are sequentially disposed on the contact 150. In some embodiments, the dielectric layer structure 170 may be between the first electrode 160 and the second electrode 180, and the first electrode 160 may be in contact with the contact 150. In other embodiments, the dielectric layer structure 170 may be between the first electrode 160 and the second electrode 180, and the second electrode 180 may be in contact with the contact 150.

Each of the first electrode 160 and the second electrode 180 may include, for example, at least one material selected from the group consisting of doped polysilicon; metals such as ruthenium (Ru), titanium (Ti), tantalum (Ta), and tungsten (W); and metal nitrides such as titanium nitride (TiN), tantalum nitride (TaN), tungsten nitride (WN), chromium nitride (CrN), vanadium nitride (VN), molybdenum nitride (MoN), niobium nitride (NbN), titanium silicon nitride (TiSiN), titanium aluminum nitride (TiAlN), and tantalum aluminum nitride (TaAlN). In some embodiments, each of the first electrode 160 and the second electrode 180 may include a single-layer or multi-layer structure of the at least one material.

The dielectric layer structure 170 may include a stack structure in which a plurality of first dielectric layers 171 and a plurality of second dielectric layers 172 are alternately stacked. The lowermost and uppermost layers of the stack structure of the dielectric layer structure 170 may be first dielectric layers 171. For example, the first dielectric layer 171 that is lowermost may face or be in contact with the first electrode 160, and the first dielectric layer 171 that is uppermost may face or be in contact with the second electrode 180. However, the stack structure of the dielectric layer structure 170 is not limited thereto.

In some embodiments, each of the first dielectric layers 171 may include a ferroelectric material. For example, the first dielectric layer 171 may include at least one selected from the group consisting of $HfO_2$, $Hf_{1-x}Zr_xO_2$ ($0<x\leq0.5$), $Ba_{1-x}Sr_xTiO_3$ ($0\leq x\leq0.3$), $BaTiO_3$, and $PbZr_xTi_{1-x}O_3$ ($0\leq x\leq0.1$).

In addition, the ferroelectric material may further include a dopant, and the dopant may include at least one selected from the group consisting of aluminum (Al), titanium (Ti), tantalum (Ta), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

In addition, each of the first dielectric layers 171 may have a first thickness in a thickness direction of the dielectric layer structure 170, and the first thickness thereof may be about 5 Å or more. For example, the first thickness thereof may be about 5 Å to about 20 Å but is not limited thereto.

In some embodiments, each of the second dielectric layers 172 may include an anti-ferroelectric material. For example, the second dielectric layer 172 may include at least one selected from the group consisting of $ZrO_2$, $PbZrO_3$, $PbTiO_3$, and $AgNbO_3$.

In addition, because the lowermost and uppermost layers of the stack structure of the dielectric layer structure 170 are the first dielectric layers 171, the second dielectric layers 172 may not directly face the first electrode 160 and the second electrode 180 or may not be in contact with the first electrode 160 and the second electrode 180.

In addition, the anti-ferroelectric material may further include a dopant, and the dopant may include at least one selected from the group consisting of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

In addition, each of the second dielectric layers 172 may have a second thickness in the thickness direction of the dielectric layer structure 170, and the second thickness thereof may be about 5 Å or more. For example, the second thickness thereof may be about 5 Å to about 20 Å but is not limited thereto.

In some embodiments, the content of the first dielectric layers 171 may be greater than the content of the second dielectric layers 172 based on the total mass of the dielectric layer structure 170. For example, a first fraction referring to the fraction of the first dielectric layers 171 in the dielectric layer structure 170 may be about 50% or more, and a second fraction referring to the fraction of the second dielectric layers 172 in the dielectric layer structure 170 may be less than about 50%.

The integrated circuit device 100 may be configured such that the distribution proportion of defect dipoles 170D may gradually vary in a vertical direction (Z direction) of the dielectric layer structure 170. The defect dipoles 170D may be derived from residual impurities present in the dielectric layer structure 170. The residual impurities may be reaction byproducts generated during the formation of the dielectric layer structure 170. For example, the defect dipoles 170D may be present inside the first dielectric layers 171 and the second dielectric layers 172. The defect dipoles 170D present inside may be based on residual impurities that are not removed according to a differential distribution of oxygen content during the formation of the dielectric layer structure 170. This is further described below.

Here, the residual impurities may include carbon (C) atoms or a hydrocarbon ($C_xH_y$)-based material. The content of residual impurities inducing the defect dipoles 170D may be from about 1% to less than about 10% based on the total mass of the dielectric layer structure 170. The content of residual impurities may increase in the thickness direction of the dielectric layer structure 170.

The dielectric layer structure 170 may have a third thickness that is the sum of the first thickness and the second thickness, and the third thickness may be about 60 Å or less. For example, the third thickness thereof may be from about 15 Å to about 60 Å but is not limited thereto.

When the dielectric layer structure 170 is formed, carbon (C) atoms or a hydrocarbon ($C_xH_y$)-based material may be formed in the first dielectric layers 171 and the second dielectric layers 172 as a byproduct according to the formation of a dielectric material. In the process of forming the dielectric layer structure 170, a reaction gas including oxygen (O) atoms may be injected to remove such a byproduct. The reaction gas may include, for example, oxygen, water vapor, or ozone. Carbon dioxide may be formed by a chemical reaction between oxygen (O) atoms included in the reaction gas and carbon (C) atoms or a hydrocarbon ($C_xH_y$)-based material formed according to the formation of a dielectric material, thereby removing impurities from the inside the dielectric layer structure 170.

In the integrated circuit device 100, the content of residual impurities may be intentionally controlled according to a differential distribution of oxygen content by adjusting the content of oxygen or the injection time of oxygen in the process of injecting the reaction gas including oxygen (O) atoms. For example, when a portion of the dielectric layer structure 170 adjacent to the first electrode 160 is formed, the reaction gas may be supplied for a relatively long time to increase the content of oxygen in the dielectric layer structure 170, and when a portion of the dielectric layer structure 170 adjacent to the second electrode 180 is formed, the reaction gas may be supplied for a relatively short time to decrease the content of oxygen in the dielectric layer structure 170. That is, the content of residual impurities may vary according to the differential distribution of oxygen content. The defect dipoles 170D may be formed inside the dielectric layer structure 170 due to the residual impurities. That is, the distribution of the defect dipoles 170D inside the dielectric layer structure 170 may be adjusted using a difference in the content of residual impurities.

Although not bound by a particular theory, when the defect dipoles 170D are gradually included inside the dielectric layer structure 170 as described above, the dielectric characteristic curve of the ferroelectric material occupying a relatively large fraction in the dielectric layer structure 170 may vary. For example, the dielectric characteristic curve (P-E curve) of the dielectric layer structure 170 indicating polarization variations (y-axis) with respect to an electric field (x-axis) may have a stepwise step-to-step variation state. Here, the dielectric characteristic curve (P-E curve) is a curve showing polarization (P) variations with respect to external electric field (E) variations.

In general, when defect dipoles are not distributed inside a dielectric layer structure, the dielectric characteristic curve of the dielectric layer structure shows an S-shaped loop. In contrast, when defect dipoles are distributed inside a dielectric layer structure, the dielectric characteristic curve of the dielectric layer structure deforms. The inventors have invented the integrated circuit device 100 using this phenomenon by intentionally forming a gradual distribution of the defective dipoles 170D to form a stepwise step-to-step variation state in some region of the dielectric characteristic curve of the integrated circuit device 100 such that when voltage is applied to vary a built-in electric field, a multi-bit status may be realized in the dielectric characteristic curve.

In most cases, the defect dipoles 170D formed inside the dielectric layer structure 170 are recognized as simple defects causing deformation of the dielectric characteristic curve. In the integrated circuit device 100, however, the distribution of the defective dipoles 170D in the dielectric layer structure 170 is intentionally adjusted using residual impurities, and thus, a hysteresis loop having a stepwise step-to-step variation state may be used as one element of a multi-bit memory device.

That is, according to the integrated circuit device 100 of an embodiments of inventive concepts, the first and second dielectric layers 171 and 172 of the dielectric layer structure 170 have different properties, and thus, when voltage is applied to vary a built-in electric field, one dielectric channel curve, that is, the dielectric characteristic curve of the integrated circuit device 100, may have a multi-bit status.

Figure 4:
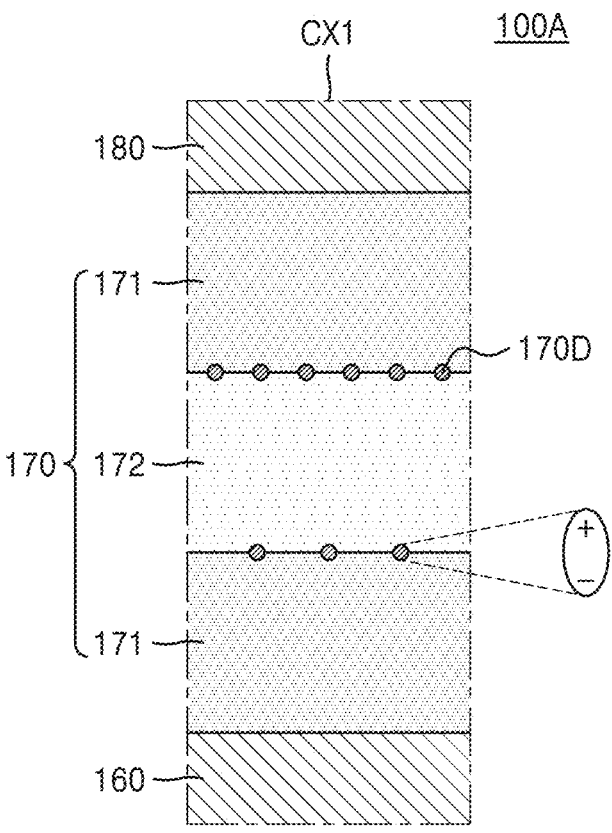
FIGS. 4 to 6 are cross-sectional views illustrating integrated circuit devices according to other embodiments.
Figure 5:
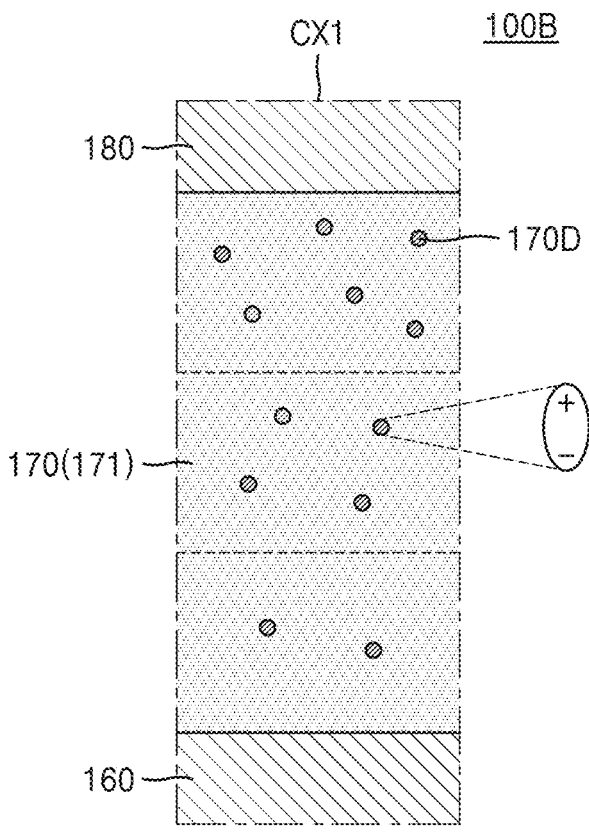
Figure 6:
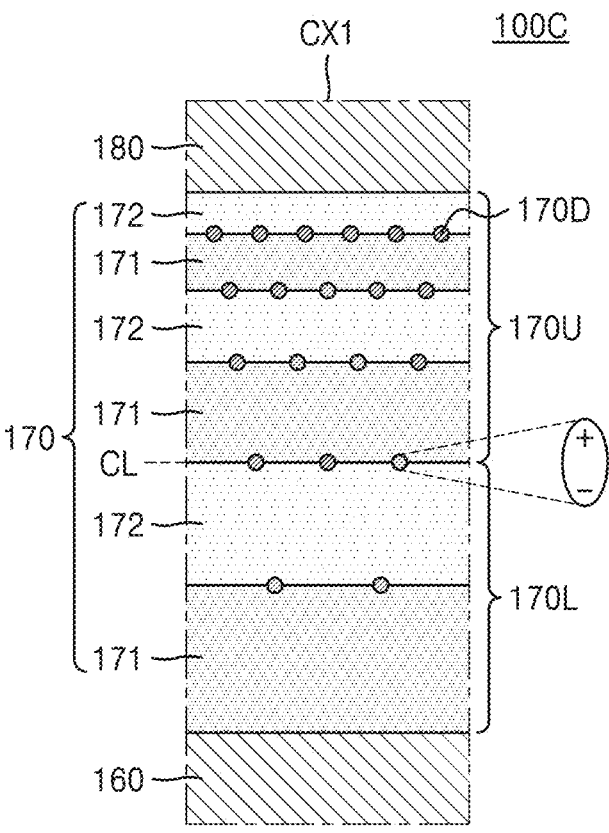

FIGS. 4 to 6 are cross-sectional views illustrating integrated circuit devices 100A, 100B, and 100C according to other embodiments.

Most of the components of the integrated circuit devices 100A, 100B, and 100C described below and materials of the components are substantially the same as or similar to those described above with reference to FIGS. 1 to 3. Therefore, for ease of description, differences from the integrated circuit device 100 described above are mainly described.

Referring to FIGS. 1 and 4 together, the integrated circuit device 100A may include a lower insulating layer 130 disposed on a substrate 110, a contact 150 disposed on the substrate 110 and partly covered with the lower insulating layer 130, and a capacitor structure CS disposed on the contact 150.

The integrated circuit device 100A of the current embodiment may be configured such that the distribution proportion of defect dipoles 170D may gradually vary in a vertical direction (Z direction) of a dielectric layer structure 170. The defect dipoles 170D may be derived from residual impurities present in interfaces of the dielectric layer structure 170. For example, the defect dipoles 170D may be present in interfaces between a plurality of first dielectric layers 171 and a plurality of second dielectric layers 172.

The defect dipoles 170D present in the interfaces may be based on residual impurities that are supplied from a metal oxide (not shown) during a heat treatment in a process of forming the metal oxide (not shown) in the interfaces.

Here, the residual impurities may include metal atoms. The metal atoms may be metal atoms (Y, Sr, Ba, Al, La, or the like) having a charge valence of less than 4+. Alternatively, the metal atoms may be metal atoms (Ta, Nb, Cr, V, or the like) having a charge balance of 4+ or more but are not limited thereto. The content of residual impurities inducing the defect dipoles 170D may be within a range of about 1% to less than about 10% based on the total mass of the dielectric layer structure 170. The content of residual impurities may increase in a thickness direction of the dielectric layer structure 170.

Referring to FIGS. 1 and 5 together, the integrated circuit device 100B may include a lower insulating layer 130 disposed on a substrate 110, a contact 150 disposed on the substrate 110 and partly covered with the lower insulating layer 130, and a capacitor structure CS disposed on the contact 150.

In the integrated circuit device 100B of the current embodiment, a dielectric layer structure 170 may be a single-layer structure of a ferroelectric material. For example, the dielectric layer structure 170 may include at least one selected from the group consisting of $HfO_2$, $Hf_{1-x}Zr_xO_2$ ($0<x\leq0.5$), $Ba_{1-x}Sr_xTiO_3$ ($0\leq x\leq0.3$), $BaTiO_3$, and $PbZr_xTi_{1-x}O_3$ ($0\leq x\leq0.1$).

In addition, the ferroelectric material may further include a dopant, and the dopant may include at least one selected from the group consisting of aluminum (Al), titanium (Ti), tantalum (Ta), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

The integrated circuit device 100B may be configured such that the distribution proportion of defect dipoles 170D may gradually vary in a vertical direction (Z direction) of the dielectric layer structure 170. The defect dipoles 170D may be derived from residual impurities present in the dielectric layer structure 170. For example, the defect dipoles 170D may be present inside the dielectric layer structure 170 having a single-layer structure. The defect dipoles 170D present inside may be based on residual impurities that are not removed according to a differential distribution of oxygen content during the formation of the dielectric layer structure 170. This is substantially the same as described above.

Here, the residual impurities may include carbon (C) atoms or a hydrocarbon ($C_xH_y$)-based material. The content of residual impurities inducing the defect dipoles 170D may be within a range of about 1% to less than about 10% based on the total mass of the dielectric layer structure 170. The content of residual impurities may increase in a thickness direction of the dielectric layer structure 170.

The dielectric layer structure 170 may have a thickness of about 60 Å or less. For example, the thickness of the dielectric layer structure 170 may be about 15 Å to about 60 Å but is not limited thereto.

Referring to FIGS. 1 and 6 together, the integrated circuit device 100C may include a lower insulating layer 130 disposed on a substrate 110, a contact 150 disposed on the substrate 110 and partly covered with the lower insulating layer 130, and a capacitor structure CS disposed on the contact 150.

The integrated circuit device 100C of the current embodiment may include a dielectric layer structure 170 having a stack structure in which a plurality of first dielectric layers 171 and a plurality of second dielectric layers 172 are alternately stacked. The lowermost and uppermost layers of the stack structure of the dielectric layer structure 170 may be first dielectric layers 171. For example, the first dielectric layer 171 that is lowermost may face or be in contact with a first electrode 160, and the first dielectric layer 171 that is uppermost may face or be in contact with a second electrode 180. However, the stack structure of the dielectric layer structure 170 is not limited thereto.

The integrated circuit device 100C of the current embodiment may include a lower stack structure 170L and an upper stack structure 170U based on a center line CL in a vertical direction (Z direction) of the dielectric layer structure 170. Here, the lower stack structure 170L and the upper stack structure 170U may have different arrangements. That is, a first fraction referring to the fraction of the first dielectric layers 171 in the dielectric layer structure 170 may be different from a second fraction referring to the fraction of the second dielectric layers in the dielectric layer structure 170. In some embodiments, the first fraction may be greater than the second fraction in the dielectric layer structure 170. For example, the ratio of the first fraction to the second fraction may be 6:4 but is not limited thereto.

According to some embodiments, in the vertical direction (Z direction), the thicknesses of first dielectric layers 171 included in the lower stack structure 170L may be greater than the thicknesses of first dielectric layers 171 included in the upper stack structure 170U. Similarly, according to some embodiments, in the vertical direction (Z direction), the thicknesses of second dielectric layers 172 included in the lower stack structure 170L may be greater than the thicknesses of second dielectric layers 172 included in the upper stack structure 170U.

The integrated circuit device 100C of the current embodiment may be configured such that the distribution proportion of defect dipoles 170D may gradually vary in the vertical direction (Z direction) of the dielectric layer structure 170. The defect dipoles 170D may be derived from residual impurities present in interfaces of the dielectric layer structure 170. For example, the defect dipoles 170D may be present in interfaces between the first dielectric layers 171 and the second dielectric layers 172.

The defect dipoles 170D present in the interfaces may be based on residual impurities that are supplied from a metal oxide (not shown) during a heat treatment in a process of forming the metal oxide (not shown) in the interfaces.

Here, the residual impurities may include metal atoms. The metal atoms may be metal atoms (Y, Sr, Ba, Al, La, or the like) having a charge valence of less than 4+. Alternatively, the metal atoms may be metal atoms (Ta, Nb, Cr, V, or the like) having a charge balance of 4+ or more but are not limited thereto. The content of residual impurities inducing the defect dipoles 170D may be within a range of about 1% to less than about 10% based on the total mass of the dielectric layer structure 170. The content of residual impurities may increase in a thickness direction of the dielectric layer structure 170.

Figure 7:
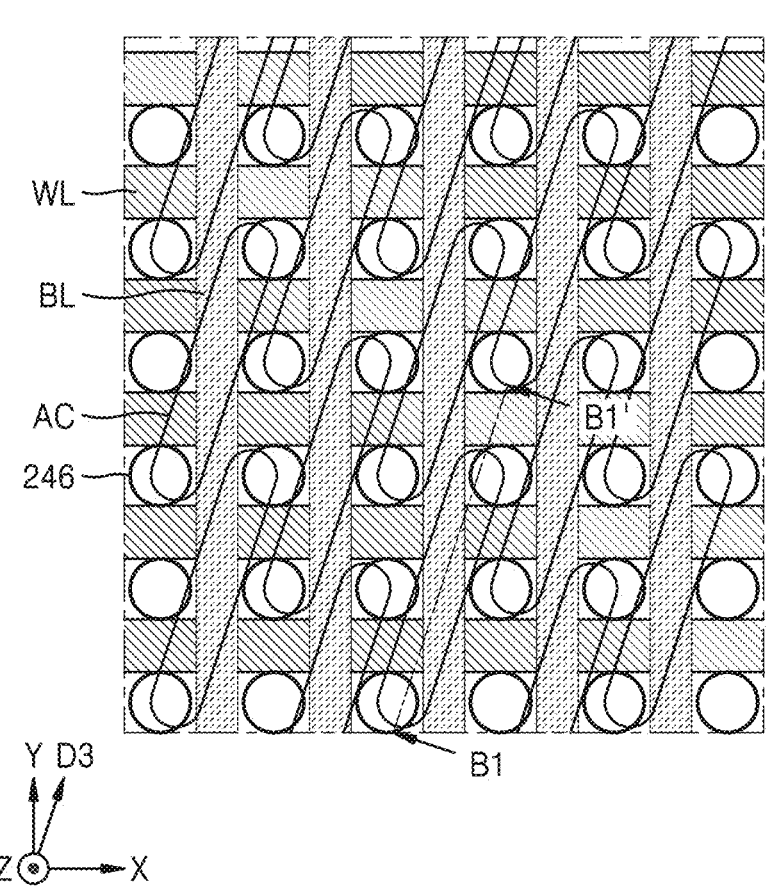
FIG. 7 is a layout illustrating an integrated circuit device according to an embodiment.
Figure 8:
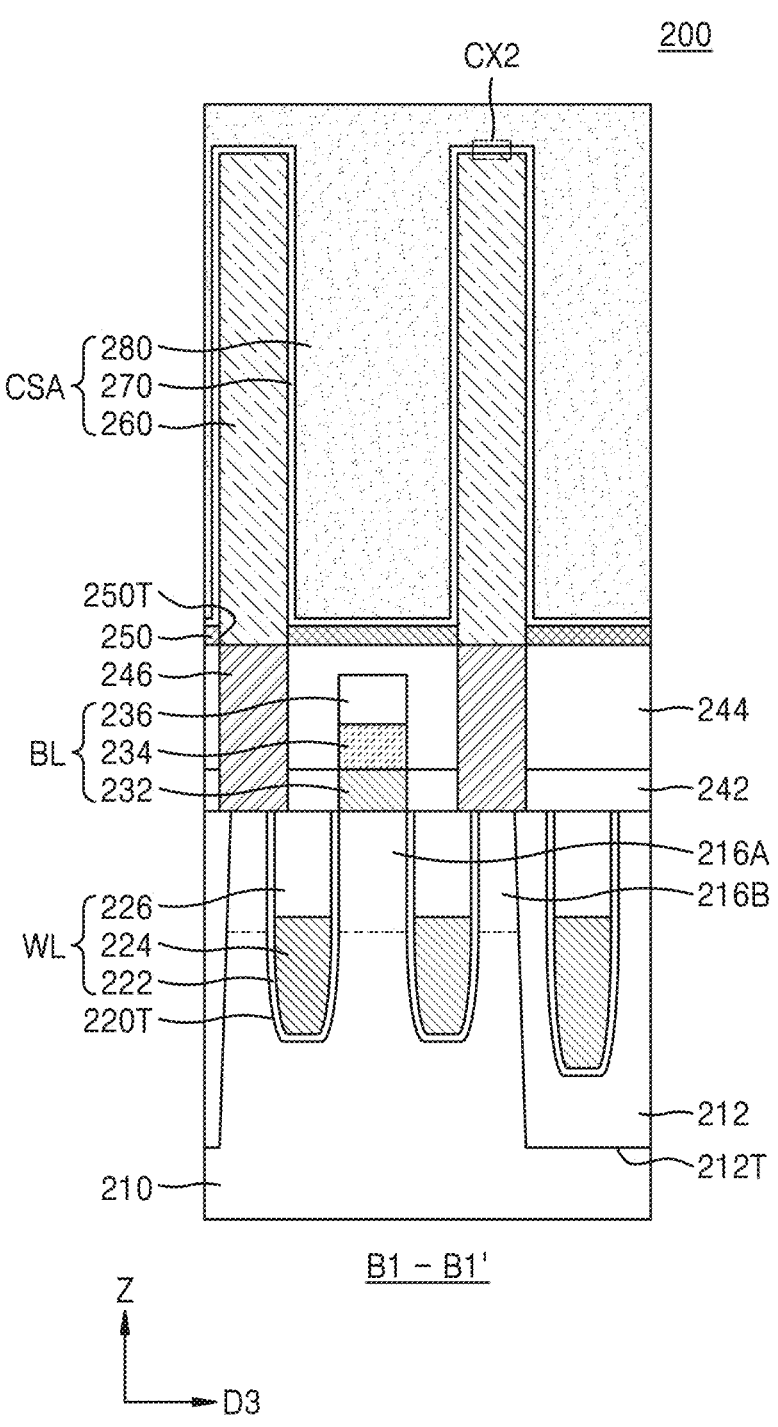
FIG. 8 is a cross-sectional view taken along line B1-B1' of FIG. 7.
Figure 9:
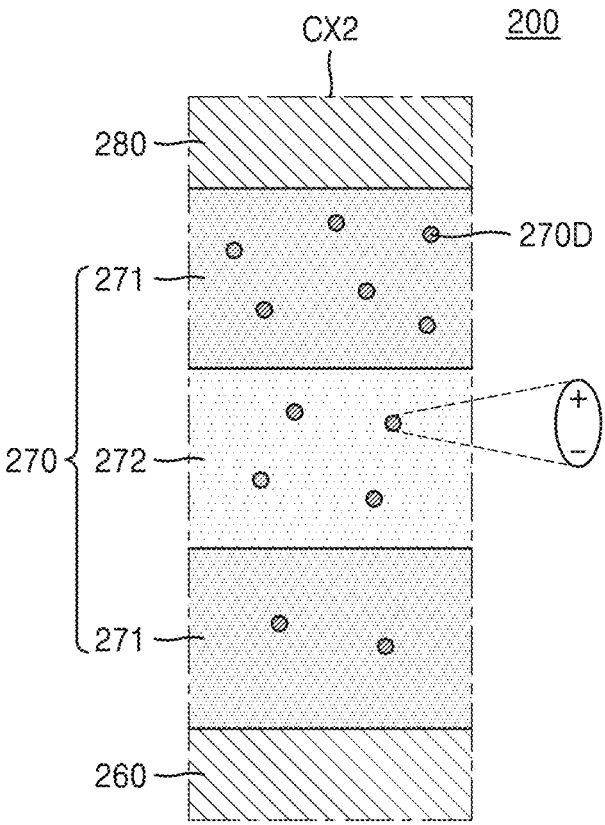
FIG. 9 is an enlarged view illustrating a portion CX2 of FIG. 8.

FIG. 7 is a layout illustrating an integrated circuit device 200 according to an embodiment, FIG. 8 is a cross-sectional view taken along line B1-B1' of FIG. 7, and FIG. 9 is an enlarged view illustrating a portion CX2 of FIG. 8.

Referring to FIGS. 7 to 9 together, the integrated circuit device 200 may include capacitor structures CSA on buried channel array transistor (BCAT) structures.

A substrate 210 may have active regions AC defined by device isolation layers 212. In some embodiments, the substrate 210 may be a silicon (Si) wafer.

In some embodiments, the device isolation layers 212 may have a shallow trench isolation (STI) structure. For example, the device isolation layers 212 may include an insulating material, and device isolation trenches 212T formed in the substrate 210 may be filled with the insulating material. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ) but is not limited thereto.

Each of the active regions AC may have a relatively long island shape having a short axis and a long axis. As shown FIGS. 7 and 8, the long axis of each of the active regions AC may be in a direction D3 parallel to an upper surface of the substrate 210. In some embodiments, the active regions AC may have a first conductivity type. The first conductivity type may be a p-type (or n-type).

The substrate 210 may include word line trenches 220T extending in an X direction. The word line trenches 220T may cross the active regions AC and may have a depth from the upper surface of the substrate 210. Some of the word line trench 220T may extend into the device isolation layers 212, and the word line trenches 220T formed in the device isolation layers 212 may have bottom surfaces lower than bottom surfaces of word line trenches 220T formed in the active regions AC.

First source/drain regions 216A and second source/drain regions 216B may be arranged in upper portions of the active regions AC at both sides of each of the word line trenches 220T. The first source/drain regions 216A and the second source/drain regions 216B may be dopant regions doped with a dopant having a second conductivity type that is different from the first conductivity type. The second conductivity type may be an n-type (or p-type).

Word lines WL may be respectively formed in the word line trenches 220T. Each of the word lines WL may include a gate insulating layer 222, a gate electrode 224, and a gate capping layer 226 that are sequentially formed on an inner wall of each of the word line trenches 220T.

The gate insulating layer 222 may be conformally formed on the inner wall of the word line trench 220T and may have a thickness. The gate insulating layer 222 may include at least one selected from the group consisting of silicon oxide, silicon nitride, silicon oxynitride, oxide/nitride/oxide (ONO), and a high-k dielectric material having a dielectric constant greater than that of silicon oxide. For example, the gate insulating layer 222 may have a dielectric constant of about 10 to about 25. In some embodiments, the gate insulating layer 222 may include $HfO_2$, $Al_2O_3$, $HfAlO_3$, $Ta_2O_3$, $TiO_2$, or a combination thereof but is not limited thereto.

The gate electrode 224 may be formed on the gate insulating layer 222 to fill the word line trench 220T from a bottom portion of the word line trench 220T to a desired and/or alternatively predetermined height. The gate electrode 224 may include a work function control layer (not shown) disposed on the gate insulating layer 222, and a buried metal layer (not shown) formed on the work function control layer and filling the bottom portion of the word line trench 220T. For example, the work function control layer may include a metal, a metal nitride, or a metal carbide such as Ti, TiN, TiAlN, TiAlC, TiAlCN, TiSiCN, Ta, TaN, TaAlN, TaAlCN, or TaSiCN, and the buried metal layer may include at least one selected from the group consisting of W, WN, TiN, and TaN.

The gate capping layer 226 may be formed on the gate electrode 224 to fill a remaining portion of the word line trench 220T. For example, the gate capping layer 226 may include at least one selected from the group consisting of silicon oxide, silicon oxynitride, and silicon nitride.

Bit lines BL extending in a Y direction perpendicular to the X direction may be formed on the first source/drain regions 216A. Each of the bit lines BL may include a bit line contact 232, a bit line conductive layer 234, and a bit line capping layer 236 that are sequentially stacked on the substrate 210. For example, the bit line contact 232 may include polysilicon, and the bit line conductive layer 234 may include a metallic material. The bit line capping layer 236 may include an insulating material such as silicon nitride or silicon oxynitride. Although FIG. 8 illustrates that a bottom surface of the bit line contact 232 is at the same level as the upper surface of the substrate 210, the bottom surface of the bit line contact 232 may be formed at a level lower than the upper surface of the substrate 210.

Optionally, a bit line intermediate layer (not shown) may be between the bit line contact 232 and the bit line conductive layer 234. The bit line intermediate layer may include a metal silicide such as tungsten silicide; or a metal nitride such as tungsten nitride. A bit line spacer (not shown) may be further formed on a sidewall of each of the bit lines BL. The bit line spacer may have a single-layer or multi-layer structure including an insulating material such as silicon oxide, silicon oxynitride, or silicon nitride. In addition, the bit line spacer may further include an air space (not shown).

A first interlayer insulating layer 242 may be formed on the substrate 210, and the bit line contact 232 may pass through the first interlayer insulating layer 242 and may be connected to a first source/drain region 216A. The bit line conductive layer 234 and the bit line capping layer 236 may be disposed on the first interlayer insulating layer 242. A second interlayer insulating layer 244 may be disposed on the first interlayer insulating layer 242 to cover lateral and upper surfaces of the bit line conductive layer 234 and the bit line capping layer 236.

Contact structures 246 may be disposed on the second source/drain regions 216B. The first and second interlayer insulating layers 242 and 244 may surround sidewalls of the contact structures 246. In some embodiments, each of the contact structures 246 may include a lower contact pattern (not shown), a metal silicide layer (not shown), and an upper contact pattern (not shown) that are sequentially stacked on the substrate 210, and a barrier layer (not shown) that surrounds lateral and bottom surfaces of the upper contact pattern. In some embodiments, the lower contact pattern may include polysilicon, and the upper contact pattern may include a metallic material. The barrier layer may include a metal nitride having conductivity.

The capacitor structures CSA may be formed on the second interlayer insulating layer 244. Each of the capacitor structures CSA may include a lower electrode 260 electrically connected to a contact structure 246, a dielectric layer structure 270 disposed on the lower electrode 260, and an upper electrode 280 disposed on the dielectric layer structure 270. In addition, an etch stop layer 250 having an opening 250T may be formed on the second interlayer insulating layer 244, and a bottom portion of the lower electrode 260 may be disposed within the opening 250T of the etch stop layer 250.

FIG. 7 illustrates that that the contact structures 246 are repeatedly arranged in the X and Y directions, and the capacitor structures CSA are repeatedly arranged on the contact structures 246 in the X and Y directions. However, unlike the arrangement shown in FIG. 7, the capacitor structures CSA may be arranged in a hexagonal shape such as a honeycomb shape on the contact structures 246 repeatedly arranged in the X and Y directions. In this case, landing pads (not shown) may be formed between the contact structures 246 and the capacitor structures CSA.

The lower electrode 260 may have a pillar shape extending on a contact structure 246 in a Z direction, and the dielectric layer structure 270 may be conformally formed on an upper surface and a sidewall of the lower electrode 260. The dielectric layer structure 270 may have a structure in which a plurality of first dielectric layers 271 and a plurality of second dielectric layers 272 are alternately stacked. The upper electrode 280 may be disposed on the dielectric layer structure 270.

The lower electrode 260, the dielectric layer structure 270, and the upper electrode 280 may be substantially the same as the first electrode 160, the dielectric layer structure 170, and the second electrode 180 described with reference to FIGS. 1 to 3. In addition, the first dielectric layers 271 and the second dielectric layers 272 may be substantially the same as the first dielectric layers 171 and the second dielectric layers 172 described with reference to FIGS. 1 to 3. Therefore, repeated descriptions thereof are omitted.

Thus, in the integrated circuit device 200 of an embodiment of inventive concepts, the capacitor structures CSA having desired capacitance may be efficiently formed using a material characteristic capable of gradually changing the direction of polarization inside ferroelectric material layers in the stacking direction of the ferroelectric material layers.

Figure 10:
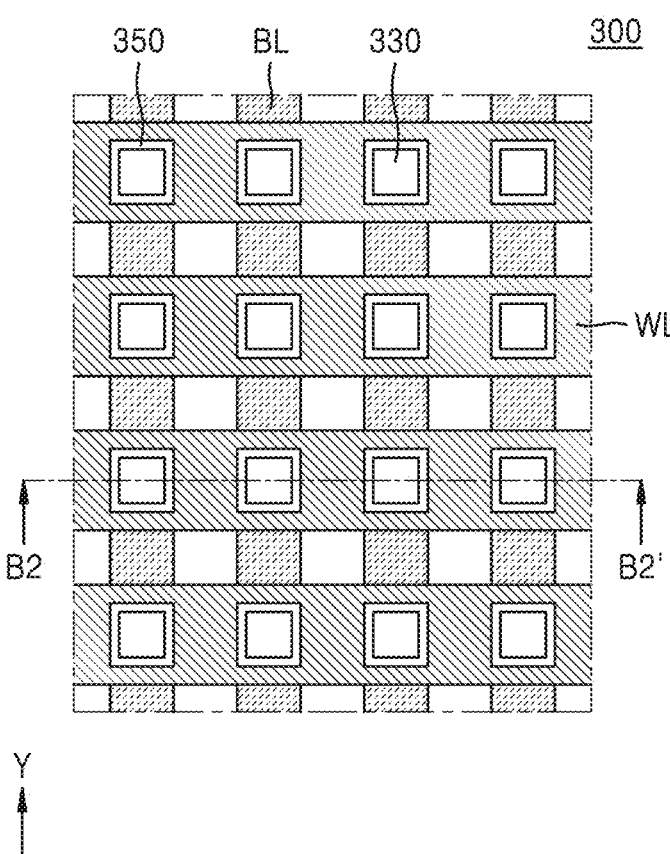
FIG. 10 is a layout illustrating an integrated circuit device according to an embodiment.
Figure 11:
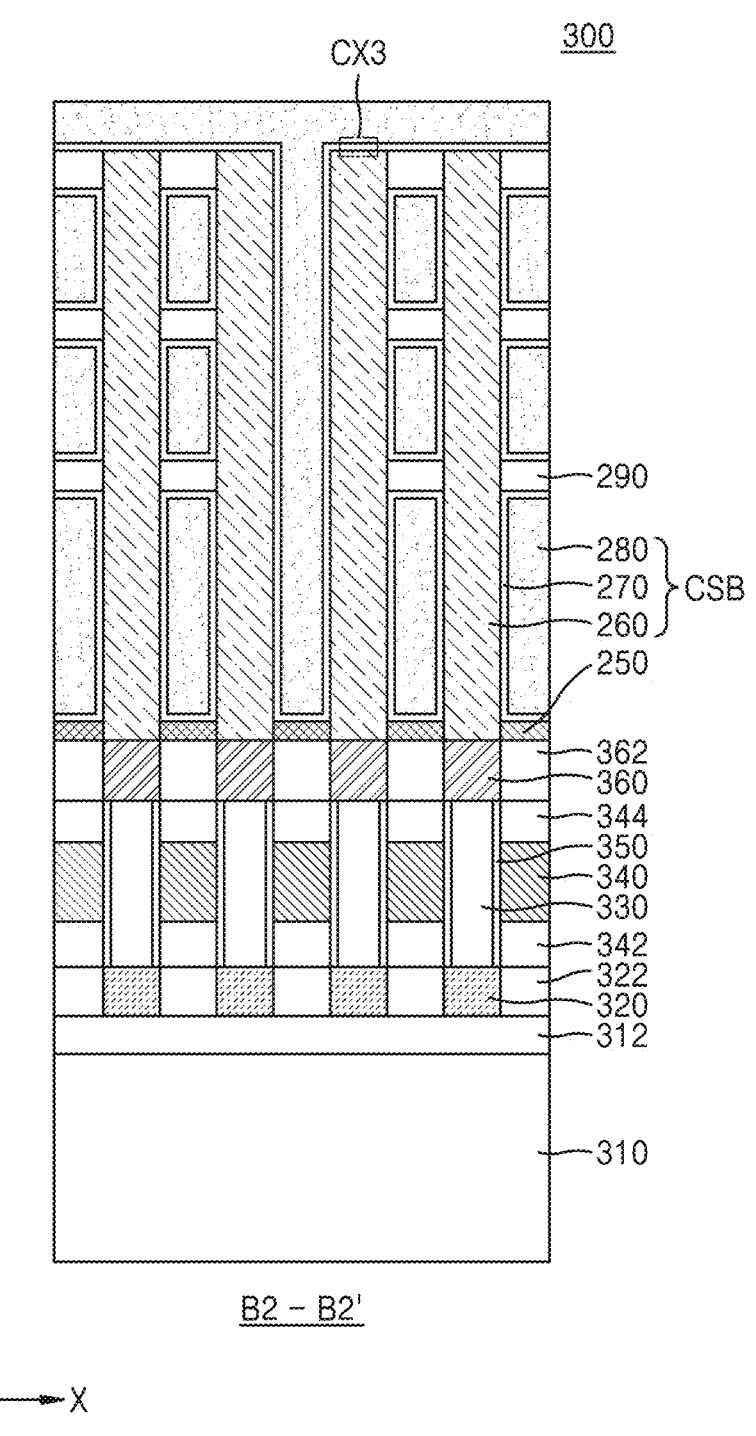
FIG. 11 is a cross-sectional view taken along line B2-B2' of FIG. 10.
Figure 12:
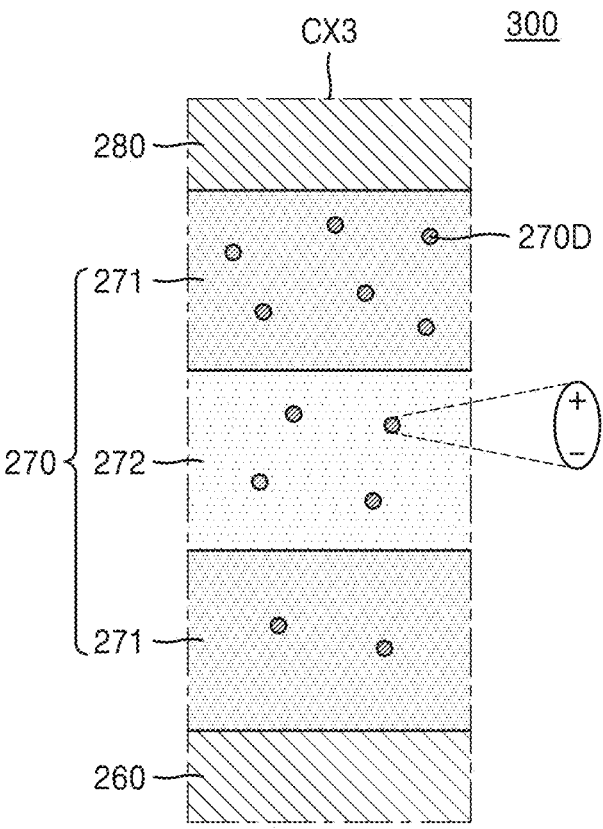
FIG. 12 is an enlarged view illustrating a portion CX3 of FIG. 11.

FIG. 10 is a layout illustrating an integrated circuit device 300 according to an embodiment, FIG. 11 is a cross-sectional view taken along line B2-B2' in FIG. 10, and FIG. 12 is an enlarged view illustrating a portion CX3 of FIG. 11.

Referring to FIGS. 10 to 12 together, the integrated circuit device 300 may include capacitor structures CSB on vertical channel transistor (VCT) structures.

A lower insulating layer 312 may be disposed on a substrate 310, and on the lower insulating layer 312, a plurality of first conductive lines 320 may extend in a Y direction apart from each other in an X direction. A plurality of first insulating patterns 322 may be arranged on the lower insulating layer 312 to fill spaces between the first conductive lines 320. The first conductive lines 320 may correspond to bit lines BL of the integrated circuit device 300.

In some embodiments, the first conductive lines 320 may include doped polysilicon, a metal, a conductive metal nitride, a conductive metal silicide, a conductive metal oxide, or a combination thereof. For example, the first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof but are not limited thereto. The first conductive lines 320 may have a single-layer or multi-layer structure of the material stated above. In some embodiments, the first conductive lines 320 may include a 2D semiconductor material, and for example, the 2D semiconductor material may include graphene, carbon nanotubes, or a combination thereof.

Channel layers 330 having an island shape may be arranged on the first conductive lines 320 apart from each other in the X and Y directions. The channel layers 330 may have a channel width in the X direction and a channel height in a Z direction, and the channel height may be greater than the channel width. Bottom portions of the channel layers 330 may function as first source/drain regions (not shown), upper portions of the channel layers 330 may function as second source/drain regions (not shown), and portions of the channel layers 330 between the first and second source/drain regions may function as channel regions (not shown). The VCT structures may refer to structures in which the channel layers 330 have a channel length defined from the substrate 310 in the Z direction.

In some embodiments, the channel layers 330 may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_x$-$Ga_yZn_zO$, $In_xGa_yO$, or a combination thereof. The channel layers 330 may have a single-layer or multi-layer structure of the oxide semiconductor. In some embodiments, the channel layers 330 may have bandgap energy greater than that of silicon. The channel layers 330 may be polycrystalline or amorphous but are not limited thereto. In some embodiments, the channel layers 330 may include a 2D semiconductor material, and for example, the 2D semiconductor material may include graphene, carbon nanotubes, or a combination thereof.

In some embodiments, gate electrodes 340 may extend in the X direction while surrounding sidewalls of the channel layers 330. Referring to FIGS. 10 to 12, the gate electrodes 340 may be of a gate-all-around type that entirely surrounds the sidewalls of the channel layers 330. The gate electrodes 340 may correspond to word lines WL of the integrated circuit device 300.

In other embodiments, the gate electrodes 340 may be of a dual gate type including, for example, first sub-gate electrodes (not shown) facing first sidewalls of the channel layers 330 and second sub-gate electrodes (not shown) facing second sidewalls of the channel layers 330 that are opposite the first sidewalls of the channel layers 330.

In other embodiments, the gate electrodes 340 may be of a single gate type extending in the X direction and covering only the first sidewalls of the channel layers 330.

The gate electrodes 340 may include doped polysilicon, a metal, a conductive metal nitride, a conductive metal silicide, a conductive metal oxide, or a combination thereof. For example, the gate electrodes 340 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof but are not limited thereto.

Gate insulating layers 350 surrounding the sidewalls of the channel layers 330 may be arranged between the channel layers 330 and the gate electrodes 340. In some embodiments, each of the gate insulating layers 350 may include a silicon oxide layer, a silicon oxynitride layer, a high-k dielectric layer having a dielectric constant greater than that of the silicon oxide layer, or a combination thereof. The high-k dielectric layer may include a metal oxide or a metal oxynitride. For example, the high-k dielectric layer that may be included in each of the gate insulating layers 350 may include $HfO_2$, HfSiO, HfSiON, HfTaO, HfTiO, HfZrO, $ZrO_2$, $Al_2O_3$, or a combination thereof, but is not limited thereto.

A first buried insulating layer 342 may be disposed on the first insulating patterns 322 to surround lower sidewalls of the channel layers 330, and a second buried insulating layer 344 may be disposed above the first buried insulating layer 342 to surround upper sidewalls of the channel layers 330 and cover the gate electrodes 340.

Capacitor contacts 360 may be disposed on the channel layers 330. The capacitor contacts 360 may vertically overlap the channel layers 330 and may be arranged in a matrix form apart from each other in the X and Y directions. The capacitor contacts 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof, but are not limited thereto. An upper insulating layer 362 may be disposed on the second buried insulating layer 344 and may surround sidewalls of the capacitor contacts 360.

An etch stop layer 250 may be disposed on the upper insulating layer 362, and the capacitor structures CSB may be disposed on the etch stop layer 250. Each of the capacitor structures CSB may include a lower electrode 260, a dielectric layer structure 270, and an upper electrode 280. The lower electrode 260 may be electrically connected to a capacitor contact 360, the dielectric layer structure 270 may cover the lower electrode 260, and the upper electrode 280 may be on the dielectric layer structure 270 and may cover the lower electrode 260. A support member 290 may be disposed on a sidewall of the lower electrode 260.

The lower electrode 260, the dielectric layer structure 270, and the upper electrode 280 may be substantially the same as the first electrode 160, the dielectric layer structure 170, and the second electrode 180 described with reference to FIGS. 1 to 3. In addition, first dielectric layers 271 and second dielectric layers 272 may be substantially the same as the first dielectric layers 171 and the second dielectric layers 172 described with reference to FIGS. 1 to 3. Therefore, repeated descriptions thereof are omitted.

Thus, in the integrated circuit device 300 of an embodiment of inventive concepts, the capacitor structures CSB having desired capacitance may be efficiently formed using a material characteristic capable of gradually changing the direction of polarization inside ferroelectric material layers in the stacking direction of the ferroelectric material layers.

Figure 13:
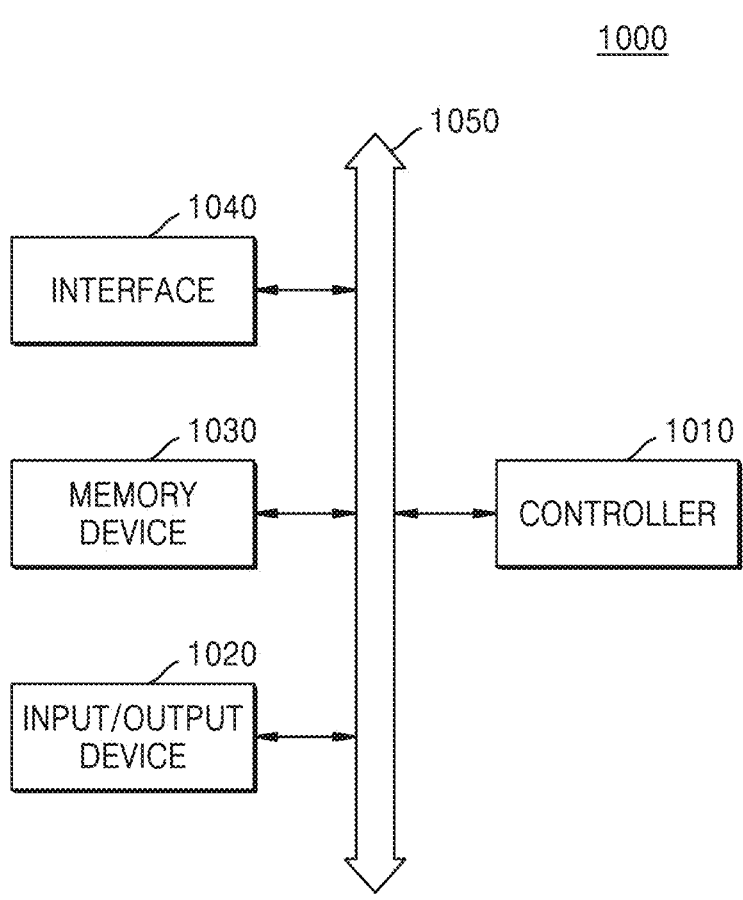
FIG. 13 is a view illustrating a configuration of a system including an integrated circuit device according to an embodiment.

FIG. 13 is a view illustrating a configuration a system 1000 including an integrated circuit device according to an embodiment.

Referring to FIG. 13, the system 1000 may include a controller 1010, an input/output device 1020, a memory device 1030, an interface 1040, and a bus 1050.

The system 1000 may be a mobile system or a system capable of transmitting or receiving information. In some embodiments, the mobile system may be a portable computer, a web tablet, a mobile phone, a digital music player, or a memory card.

The controller 1010 may control programs running on the system 1000, and may include a microprocessor, a digital signal processor, a microcontroller, or a device similar thereto.

The input/output device 1020 may be used to input data to the system 1000 or output data from the system 1000. The system 1000 may be connected to an external apparatus such as a personal computer or a network and may exchange data with the external apparatus through the input/output device 1020. The input/output device 1020 may be, for example, a touch screen, a touch pad, a keyboard, or a display device.

The memory device 1030 may store data for operations of the controller 1010 or data processed by the controller 1010. The memory device 1030 may include any one of the integrated circuit devices 100, 100A, 100B, 100C, 200, and 300 described above according to embodiments of inventive concepts.

The interface 1040 may be a data transmission path between the system 1000 and an external apparatus. The controller 1010, the input/output device 1020, the memory device 1030, and the interface 1040 may communicate with each other via the bus 1050.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concepts have been particularly shown and described with reference to embodiments thereof, it will be understood that various changes in form and details may be made therein without departing from the spirit and scope of the following claims.

What is claimed is:

1. An integrated circuit device comprising:
a transistor on a substrate; and
a capacitor structure electrically connected to the transistor, wherein the capacitor structure includes a first electrode, a dielectric layer structure on the first electrode, and a second electrode on the dielectric layer structure, the dielectric layer structure includes a plurality of first dielectric layers and a plurality of second dielectric layers that are alternately stacked, the plurality of first dielectric layers include a ferroelectric material, the plurality of second dielectric layers include an antiferroelectric material, and a distribution proportion of internal defect dipoles gradually varies in a thickness direction of the dielectric layer structure.

2. The integrated circuit device of claim 1, wherein a first fraction corresponds to a fraction of the plurality of first dielectric layers in the dielectric layer structure, based on a total amount of the dielectric layer structure, a second fraction corresponds to a fraction of the plurality of second dielectric layers in the dielectric layer structure, based on the total amount of the dielectric layer structure, and the first fraction is greater than the second fraction such that a content of the plurality of first dielectric layers is greater than a content of the plurality of second dielectric layers in the dielectric layer structure.

3. The integrated circuit device of claim 1, wherein the internal defect dipoles are present inside the plurality of first dielectric layers and the plurality of second dielectric layers.

4. The integrated circuit device of claim 3, wherein the internal defect dipoles, which are present inside the plurality of first dielectric layers and the plurality of second dielectric layers, are derived from residual impurities that are not removed according to a differential distribution of oxygen content during a process of forming the dielectric layer structure.

5. The integrated circuit device of claim 4, wherein the residual impurities comprise carbon (C) atoms or a hydrocarbon ($C_xH_y$)-based material.

6. The integrated circuit device of claim 1, wherein the internal defect dipoles are present in interfaces between the plurality of first dielectric layers and the plurality of second dielectric layers.

7. The integrated circuit device of claim 6, wherein the internal defect dipoles present in the interfaces are derived from residual impurities that are supplied from a metal oxide during a heat treatment in a process of forming the metal oxide in the interfaces between the plurality of first dielectric layers and the plurality of second dielectric layers.

8. The integrated circuit device of claim 7, wherein the residual impurities comprise metal atoms.

9. The integrated circuit device of claim 1, wherein each of the plurality of first dielectric layers has a first thickness in a vertical direction perpendicular to an upper surface of the first electrode, the first thickness ranges from about 5 Å to about 20 Å, each of the plurality of second dielectric layers has a second thickness in the vertical direction, the second thickness ranges from about 5 Å to about 20 Å, the dielectric layer structure has a third thickness in the vertical direction, and the third thickness ranges from about 15 Å to about 60 Å.

10. The integrated circuit device of claim 1, wherein
a dielectric characteristic curve of the dielectric layer
structure has a stepwise step-to-step polarization varia-
tion state with respect to an electric field.

11. An integrated circuit device comprising:
a transistor on a substrate; and
a capacitor structure electrically connected to the transis-
tor, wherein
the capacitor structure includes a first electrode, a dielec-
tric layer structure on the first electrode, and a second
electrode on the dielectric layer structure,
the dielectric layer structure includes a single ferroelectric
material, and
a distribution proportion of internal defect dipoles gradu-
ally varies in a thickness direction of the dielectric layer
structure.

12. The integrated circuit device of claim 11, wherein
the internal defect dipoles are derived from residual
impurities present inside the dielectric layer structure,
and
the residual impurities comprise carbon (C) atoms or a
hydrocarbon ($C_xH_y$)-based material.

13. The integrated circuit device of claim 12, wherein
a content of the residual impurities ranges from about 1%
to less than about 10% based on a total mass of the
dielectric layer structure, and
the content of the residual impurities increases in the
thickness direction of the dielectric layer structure.

14. The integrated circuit device of claim 11, wherein
the internal defect dipoles are present inside the dielectric
layer structure, and
the internal defect dipoles present inside are derived from
residual impurities that are not removed according to a
differential distribution of oxygen content during a
process of forming the dielectric layer structure.

15. The integrated circuit device of claim 11, wherein a
dielectric characteristic curve of the single ferroelectric
material of the dielectric layer structure has a stepwise
step-to-step polarization variation state with respect to an
electric field.

16. An integrated circuit device comprises:
a transistor on a substrate; and
a capacitor structure electrically connected to the transis-
tor, wherein
the capacitor structure includes a first electrode, a dielec-
tric layer structure on the first electrode, and a second
electrode on the dielectric layer structure,
the dielectric layer structure includes a plurality of first
dielectric layers and a plurality of second dielectric
layers that are alternately stacked,
the plurality of first dielectric layers include a ferroelectric
material, the plurality of second dielectric layers include an anti-
ferroelectric material,
the dielectric layer structure includes a lower stack struc-
ture and an upper stack structure having different
arrangements,
the lower stack structure and the upper stack structure are
defined based on a center of the dielectric layer struc-
ture in a vertical direction such that the lower stack
structure is under the center of the dielectric layer
structure and the upper stack structure is over the center
of the dielectric layer structure, and
a distribution proportion of internal defect dipoles gradu-
ally varies in the vertical direction of the dielectric
layer structure.

17. The integrated circuit device of claim 16, wherein
a first fraction corresponds to a fraction of the plurality of
first dielectric layers in the dielectric layer structure,
based on a total amount of the dielectric layer structure,
a second fraction corresponds to a fraction of the plurality
of second dielectric layers in the dielectric layer struc-
ture, based on the total amount of the dielectric layer
structure, and
the first fraction is greater than the second fraction.

18. The integrated circuit device of claim 16, wherein
the internal defect dipoles are derived from residual
impurities,
the residual impurities comprise carbon (C) atoms or a
hydrocarbon ($C_xH_y$)-based material,
the residual impurities are present inside the plurality of
first dielectric layers and the plurality of second dielec-
tric layers, and
the internal defect dipoles present inside are derived from
residual impurities that are not removed according to a
differential distribution of oxygen content during a
process of forming the dielectric layer structure.

19. The integrated circuit device of claim 16, wherein
the internal defect dipoles are derived from residual
impurities,
the internal defect dipoles comprise metal atoms,
the internal defect dipoles are present in interfaces
between the plurality of first dielectric layers and the
plurality of second dielectric layers, and
the internal defect dipoles present in the interfaces are
derived from residual impurities that are supplied from
a metal oxide during a heat treatment in a process of
forming the metal oxide in the interfaces.

20. The integrated circuit device of claim 16, wherein a
dielectric characteristic curve of the dielectric layer structure
has a stepwise step-to-step polarization variation state with
respect to an electric field.

* * * * *